(12) United States Patent
Seddon et al.

(10) Patent No.: US 8,445,375 B2
(45) Date of Patent: May 21, 2013

(54) METHOD FOR MANUFACTURING A SEMICONDUCTOR COMPONENT

(75) Inventors: Michael J. Seddon, Gilbert, AZ (US); Francis J. Carney, Queen Creek, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 552 days.

(21) Appl. No.: 12/569,732

(22) Filed: Sep. 29, 2009

(65) Prior Publication Data

US 2011/0074034 A1    Mar. 31, 2011

(51) Int. Cl.
*H01L 21/44*    (2006.01)
(52) U.S. Cl.
USPC .................................. 438/614; 257/E21.506
(58) Field of Classification Search
USPC .................................. 257/E21.506; 438/614
See application file for complete search history.

(56) References Cited

U.S. PATENT DOCUMENTS

| | | | |
|---|---|---|---|
| 5,376,584 A | * | 12/1994 | Agarwala .................. 438/614 |
| 6,683,375 B2 | | 1/2004 | Joshi et al. |
| 6,753,605 B2 | | 6/2004 | Joshi |

* cited by examiner

*Primary Examiner* — Colleen Matthews
(74) *Attorney, Agent, or Firm* — Rennie William Dover

(57) ABSTRACT

A semiconductor component and methods for manufacturing the semiconductor component that includes a double exposure of a layer of photoresist or the use of multiple layers of photoresist. A metallization structure is formed on a layer of electrically conductive material that is disposed on a substrate and a layer of photoresist is formed on the metallization structure. The layer of photoresist is exposed to light and developed to remove a portion of the photoresist layer, thereby forming an opening. Then, a larger portion of the photoresist layer is exposed to light and an electrically conductive interconnect is formed in the opening. The larger portion of the photoresist layer that was exposed to light is developed to expose edges of the electrically conductive interconnect and portions of the metallization structure. A protection layer is formed on the top and edges of the electrically conductive interconnect and on the exposed portions of the metallization structure.

10 Claims, 4 Drawing Sheets

METHOD FOR MANUFACTURING A SEMICONDUCTOR COMPONENT

TECHNICAL FIELD

The present invention relates, in general, to semiconductor components and, more particularly, to metallization systems in semiconductor components.

BACKGROUND

Semiconductor components include one or more semiconductor devices manufactured from a semiconductor substrate. Typically, metal interconnects are formed over the semiconductor substrate to electrically connect semiconductor devices to each other or to electrical contacts for transmission of electrical signals to other devices. FIG. 1 is a cross-sectional view of a prior art semiconductor component 10 formed from a silicon substrate 12. Although not shown, semiconductor devices are formed from silicon substrate 12. An aluminum layer 14 is formed on silicon substrate 12 and a dielectric passivation layer 16 is formed over a portion of aluminum layer 14 and over silicon substrate 12. A seed metal layer 18 is formed on the portion of aluminum layer 14 that is unprotected by dielectric passivation layer 16 and over a portion of dielectric passivation layer 16. A copper interconnect 20 having a top surface 26 and side surfaces 28 is formed on seed metal layer 18 using an electroplating technique. An electroless nickel gold (Ni/Au) protective structure 22 is formed on the exposed surfaces of copper interconnect 20, where protective structure 22 comprises a layer of nickel 23 formed on copper interconnect 20 and a layer of gold 25 formed on nickel layer 23. Aluminum layer 14, seed metal layer 18, and copper interconnect 20 form a metallization system 24. A drawback with this approach is that when seed metal layer 18 is etched away, it may be overetched or undercut forming an undercut region 19. Acids or other contaminants may be trapped in undercut region 19 which cause corrosion and degrade the reliability of semiconductor component 10. Another drawback is that the manufacturing flow includes two separate and expensive plating processes.

FIG. 2 is a cross-sectional view of another prior art semiconductor component 50. Semiconductor component 50 is similar to semiconductor component 10 except that protective structure 22 is absent from top surface 26 and side surfaces 28 and an electroplated metal structure 52 is formed on top surface 26 of copper interconnect 20 but is absent from side surfaces 28. Metal structure 52 may be an electroplated metal layer 53 in contact with copper interconnect 20 and an electroplated layer metal layer 55 in contact with nickel layer 53. Metal layer 53 may be nickel and metal layer 55 may be palladium or metal layer 53 may be nickel and metal layer 55 may be gold or the like. A layer of gold 54 is formed on nickel palladium layer 52. A disadvantage of semiconductor component 50 is that side surfaces 28 are unprotected and susceptible to corrosion and electromigration.

Accordingly, it would be advantageous to have a method for protecting metallization systems and a metallization system that protects against electro-migration and corrosion. It would be of further advantage for the method and structure to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

In the following description and claims, the terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Generally the present invention provides a semiconductor component and a method for manufacturing the semiconductor component that protects the metallization systems of the semiconductor component from damage by, for example, electromigration. In accordance with an embodiment of the present invention, the semiconductor component is manufactured using a double exposure of a photosensitive material such as, for example, a photoresist layer during the formation of a copper protective layer. In the double exposure, a photoresist layer is formed over an electrically conductive layer and a portion of the photoresist layer is exposed to ultraviolet radiation, e.g., a first dose of light, and developed to form an opening that exposes a portion of the electrically conductive layer. Before the photoresist layer is hard baked, another portion of the layer of photoresist is exposed to a second dose of light and an electrical interconnect material such as, for example, copper, is formed on the portion of the electrically conductive layer uncovered by the opening in the photoresist layer. Then, the portion of the photoresist layer previously exposed to the second dose of light is developed to uncover additional portions of the electrically conductive layer. A protective layer is formed over the exposed portions of the electrical interconnect material and over portions of the electrically conductive layer that were uncovered by the development of the photoresist after the second exposure.

Figure 1:
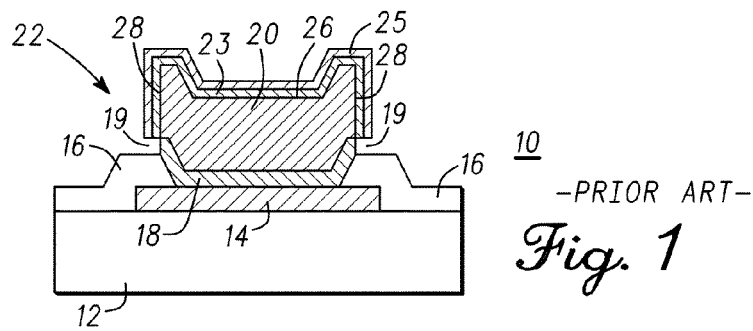
FIG. 1 is a cross-sectional view of a prior art semiconductor component having a metallization system formed over a semiconductor substrate.
Figure 2:
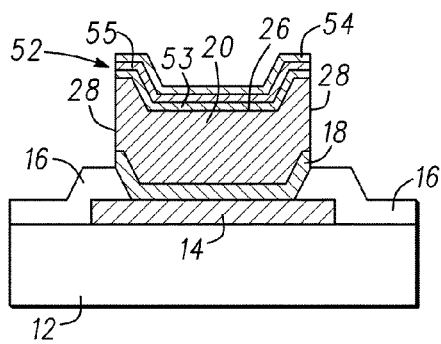
FIG. 2 is a cross-sectional view of another prior art semiconductor component having a metallization system formed over a semiconductor substrate.
Figure 3:
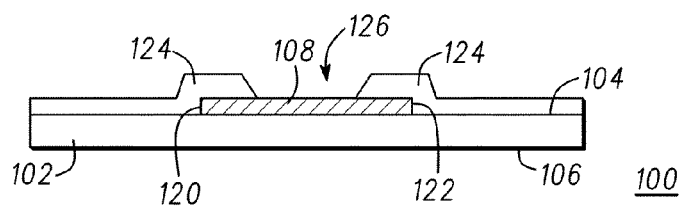
FIG. 3 is a cross-sectional view of a semiconductor component at an early stage of manufacture having a metallization system formed over a semiconductor substrate in accordance with an embodiment of the present invention.

FIG. 3 is a cross-sectional view of a portion of a semiconductor component 100 during manufacture in accordance with an embodiment of the present invention. What is shown in FIG. 3 is a material 102 having opposing surfaces 104 and 106. Surface 104 is referred to as a front or top surface and surface 106 is referred to as a bottom or back surface. Material 102 may be a semiconductor material such as, for example, an epitaxial layer formed on a semiconductor substrate, a semiconductor substrate, a substrate such as, for example, a printed circuit board, or the like. In accordance with embodiments in which material 102 is a semiconductor material, one or more semiconductor devices may be formed in or from semiconductor material 102. When a single semiconductor device is formed in or from semiconductor material 102, it is typically referred to as a discrete device and when a plurality of semiconductor devices are formed in or from semiconductor material 102 they typically referred to as an integrated circuit.

An electrically conductive structure or material 108 having edges 120 and 122 is formed on or over semiconductor material 102. By way of example, electrically conductive structure 108 is aluminum. Other suitable materials for electrically conductive structure 108 include, copper, aluminum copper, aluminum silicon, aluminum silicon copper, or the like. Electrically conductive structure 108 may serve as a bond pad, an electrical interconnect, a power bus, or the like. A passivation layer 124 comprising a dielectric material is formed on or over semiconductor material 102 and an opening 126 is formed in passivation layer 124 which opening exposes a portion of electrically conductive structure 108.

Figure 4:
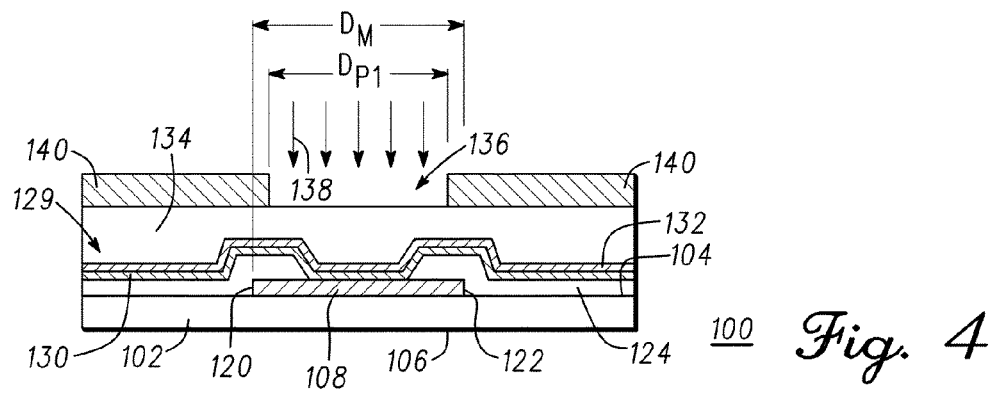
FIG. 4 is a cross-sectional view of the semiconductor component of FIG. 3 at a later stage of manufacture.

Referring now to FIG. 4, an electrically conductive structure or material 129 is formed on passivation layer 124 and on the exposed portion of electrically conductive structure 108. In accordance with an embodiment of the present invention, electrically conductive structure 129 is comprised of a layer of electrically conductive material 132 formed on an electrically conductive layer 130 which preferably is in contact with electrically conductive structure 108. By way of example, electrically conductive layer 130 is a titanium tungsten (TiW) layer that is formed by sputter deposition and electrically conductive layer 132 is a copper (Cu) layer that is also formed by sputter deposition. Electrically conductive layer 130 and 132 may be referred to as a seed metal layer or under bump metallization. A layer of a photosensitive material such as photoresist 134 is formed on electrically conductive structure 129, i.e., layer of photoresist 134 is formed on electrically conductive layer 132. In accordance with embodiments of the present invention, photoresist layer 134 is a positive photoresist.

A portion 136 of photoresist layer 134 is exposed to light 138 such as, for example UltraViolet (UV) radiation, through a plating mask 140. A dimension $D_{P1}$ represents a dimension of exposed portion 136 and a dimension $D_M$ represents a dimension of electrically conductive structure 108. By way of example, dimension $D_{P1}$ is a width of portion 136 and dimension $D_M$ is a width of electrically conductive structure 108. Although dimension $D_{P1}$ of portion 136 is shown as being less than the dimension $D_M$ of electrically conductive structure 108, this is not a limitation of the present invention. Dimension $D_{P1}$ can be greater than dimension $D_M$ or equal to dimension $D_M$.

Figure 5:
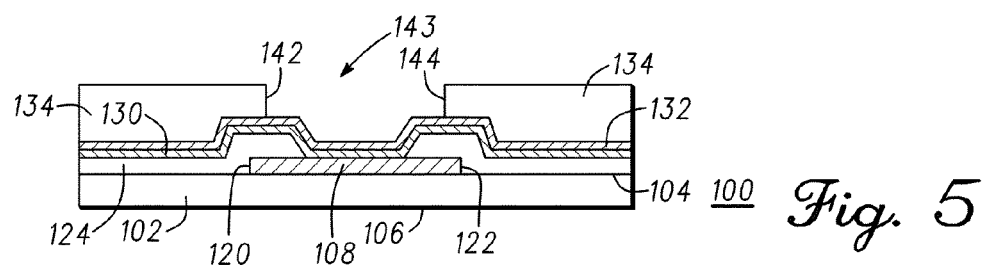
FIG. 5 is a cross-sectional view of the semiconductor component of FIG. 4 at a later stage of manufacture.

Referring now to FIG. 5, the exposed portion of photoresist layer 134 is developed which removes a portion 136 of photoresist layer 134. Removing portion 136 leaves sidewalls 142 and 144 and uncovers a portion of electrically conductive layer 132, leaving a gap 143 between sidewalls 142 and 144.

Figure 6:
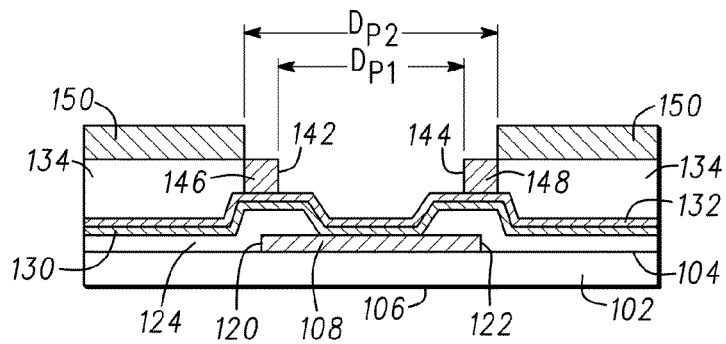
FIG. 6 is a cross-sectional view of the semiconductor component of FIG. 5 at a later stage of manufacture.

Referring now to FIG. 6, portions 146 and 148 of photoresist layer 134 are exposed to light 138 through a plating mask 150. It should be noted that a hard bake may be or may not be performed before the removal of portion 136 or before exposing photoresist layer 134 a second time, i.e., the hard bake is an optional step. A dimension $D_{P2}$ represents a dimension of the portion of photoresist layer 134 that is exposed by plating mask 150. Dimension $D_{P2}$ is greater than dimension $D_{P1}$ and may be less than dimension $D_M$, greater than dimension $D_M$, or equal to dimension $D_M$. In the example shown in FIG. 5, dimension $D_{P2}$ is greater than dimension $D_M$.

Figure 7:
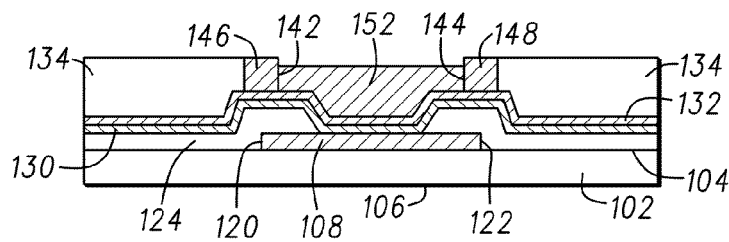
FIG. 7 is a cross-sectional view of the semiconductor component of FIG. 6 at a later stage of manufacture.

Referring now to FIG. 7, before developing exposed portions 146 and 148 of photoresist layer 134, an electrically conductive structure 152 is formed on the exposed portion of electrically conductive layer 132. Electrically conductive structure 152 is laterally bounded by sidewalls 142 and 144. By way of example, electrically conductive structure 152 is copper formed using a plating process. Other suitable materials for electrically conductive structure 152 include nickel or the like.

Figure 8:
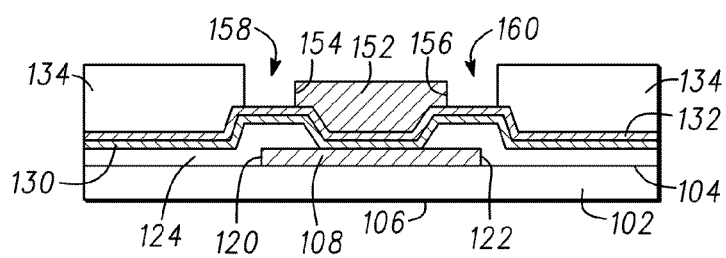
FIG. 8 is a cross-sectional view of the semiconductor component of FIG. 7 at a later stage of manufacture.

Referring now to FIG. 8, portions 146 and 148 of photoresist layer 134 are developed and removed. Optionally, after removal, the remaining portions of photoresist layer 134 may be hard baked. Removal of portions 146 and 148 exposes sidewalls or edges 154 and 156 of electrically conductive structure 152 and portions 158 and 160 of electrically conductive layer 132. It should be noted that the dimension $D_{P2}$ shown in FIG. 6 is greater than the distance between sidewalls or edges 154 and 156.

Figure 9:
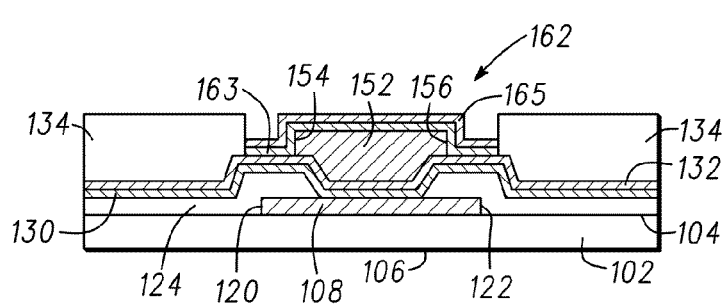
FIG. 9 is a cross-sectional view of the semiconductor component of FIG. 8 at a later stage of manufacture.

Referring now to FIG. 9, an electrically conductive structure or material 162 is formed over electrically conductive structure 152, along sidewalls 154 and 156, and over the uncovered portions 158 and 160 of electrically conductive layer 132. Electrically conductive structure 162 may be referred to as a protective structure and may be comprised of one or more layers. Preferably, electrically conductive structure 162 is a multi-layer structure that is formed using an electroplating technique and that protects electrically conductive structure 152. For example, electrically conductive structure 162 may be a two layer structure comprising an electrically conductive layer 163 formed in contact with electrically conductive structure 152 and an electrically conductive layer 165 formed in contact with electrically conductive layer 163. In according with an embodiment of the present invention, electrically conductive layer 163 is nickel and electrically conductive layer 165 is gold. Alternatively, electrically conductive material 163 may be nickel and electrically conductive layer 165 may be tin; or electrically conductive material 163 may be nickel and electrically conductive material 165 may be palladium; or electrically conductive material 163 may be tin and electrically conductive material 165 may be palladium; or electrically conductive material 163 may be a copper and electrically conductive material 165 may be gold; or electrically conductive material 163 may be copper and electrically conductive material 165 may be tin; or electrically conductive material 163 may be nickel and electrically conductive layer 165 may be solder; or electrically conductive material 163 may be solder and electrically conductive layer 165 may be tin; or the like.

It should be further noted that suitable materials for covering the copper are those that protect the copper from oxidizing. Although structure 162 has been described as being an electrically conductive structure, this is not a limitation of the present invention. Structure 162 may be formed from an electrically nonconductive material such as, epoxy, polyimide, or the like.

Figure 10:
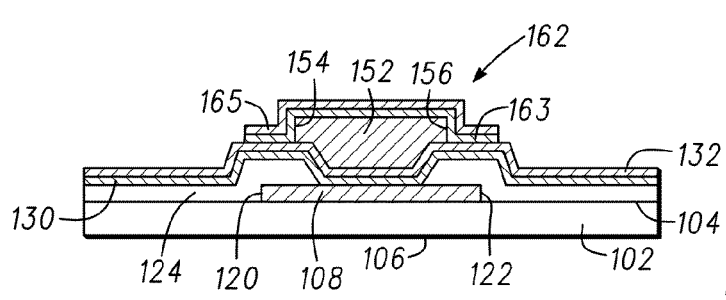
FIG. 10 is a cross-sectional view of the semiconductor component of FIG. 9 at a later stage of manufacture.

Referring now to FIG. 10, photoresist layer 134 is removed using techniques known to those skilled in the art.

Figure 11:
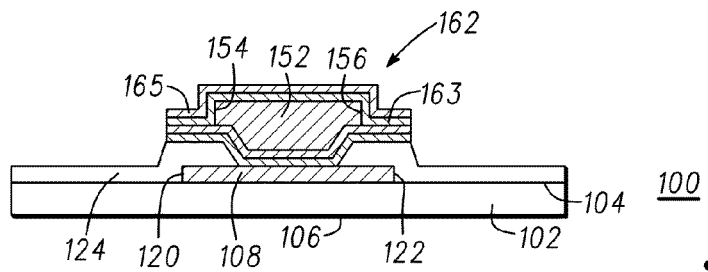
FIG. 11 is a cross-sectional view of the semiconductor component of FIG. 10 at a later stage of manufacture.

Referring now to FIG. 11, the exposed portions of electrically conductive structure 129 are removed using, for example, a wet chemical etching process. The technique for removing electrically conductive structure 129 is not a limitation of the present invention.

Figure 12:
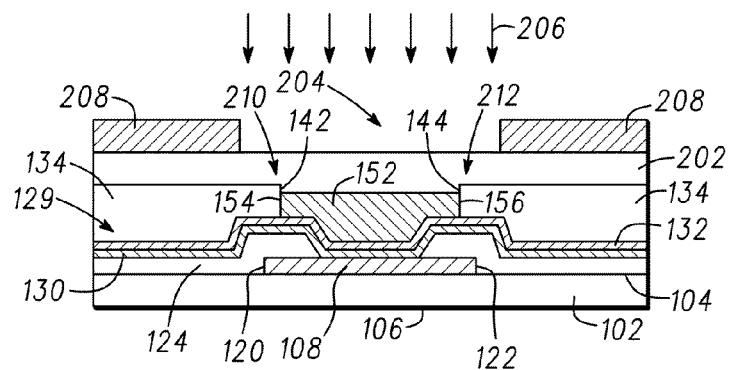
FIG. 12 is a cross-sectional view of the semiconductor component of FIG. 5 at a later stage of manufacture in accordance with another embodiment of the present invention.

FIG. 12 is a cross-sectional view of a portion of a semiconductor component 200 during manufacture in accordance with another embodiment of the present invention. It should be noted that the beginning steps in manufacturing semiconductor component 200 are similar to those for manufacturing semiconductor component 100. Thus, the manufacturing steps shown in FIGS. 3-5 for semiconductor component 100 may be used for manufacturing semiconductor component 200. Accordingly, the description of FIG. 11 continues from that of FIG. 5, where reference character 100 has been replaced by reference character 200. Electrically conductive structure 152 is formed on the exposed portion of electrically conductive layer 132. Electrically conductive structure 152 is laterally bounded by sidewalls 142 and 144. By way of example, electrically conductive structure 152 is copper formed using a plating process. Other suitable materials for electrically conductive structure 152 include nickel or the like.

A layer of a photosensitive material 202 such as, for example, photoresist, is formed on electrically conductive structure 152 and on the remaining portion of photoresist layer 134. In accordance with embodiments of the present invention, photoresist layer 202 is a positive photoresist.

A portion 204 of photoresist layer 202 is exposed to light 206 such as, for example UltraViolet (UV) radiation, through a plating mask 208. In addition portions 210 and 212 of photoresist layer 134 underlying the portion of photoresist layer 202 that is unprotected by plating mask 208 are also exposed to light 206.

Figure 13:
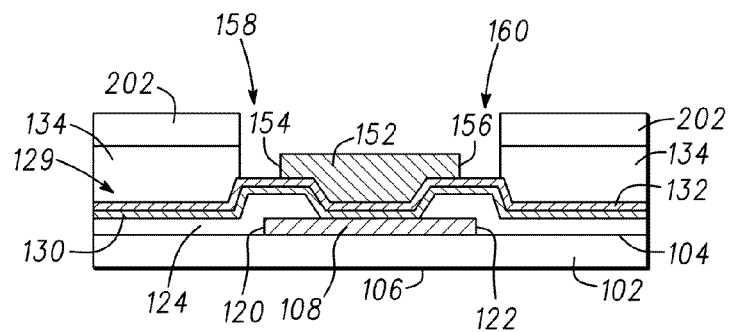
FIG. 13 is a cross-sectional view of the semiconductor component of FIG. 12 at a later stage of manufacture.

Referring now to FIG. 13, the portions of photoresist layer 202 and portions 210 and 212 of photoresist layer 134 that were exposed to light 206 (shown in FIG. 12) are developed and removed. Optionally, after removal, the remaining portions of photoresist layers 134 and 202 may be hard baked. Removal of portions 210 and 212 exposes sidewalls or edges 154 and 156 of electrically conductive structure 152 and portions 158 and 160 of electrically conductive layer 132.

Figure 14:
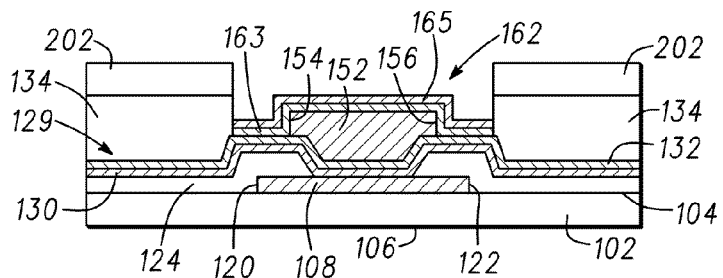
FIG. 14 is a cross-sectional view of the semiconductor component of FIG. 13 at a later stage of manufacture.

Referring now to FIG. 14, an electrically conductive structure or material 162 is formed over electrically conductive structure 152, along sidewalls 154 and 156, and over the uncovered portions 158 and 160 of electrically conductive layer 132. Preferably, electrically conductive structure 162 is formed using an electroplating technique. Electrically conductive structure 162 protects electrically conductive structure 152. Suitable materials for electrically conductive structure 162 have been described with reference to FIG. 9.

Figure 15:
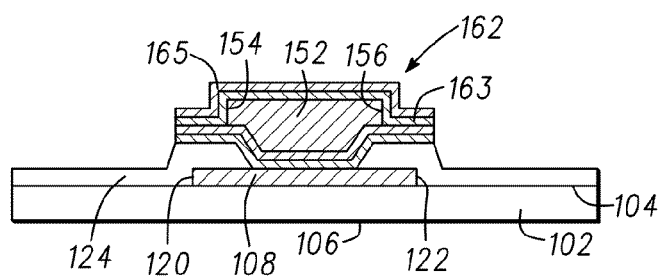
FIG. 15 is a cross-sectional view of the semiconductor component of FIG. 14 at a later stage of manufacture.

Referring now to FIG. 15, the remaining portions of photoresist layers 134 and 202 are removed using techniques known to those skilled in the art. Removing the remaining portions of photoresist layers 134 and 202 exposes portions of electrically conductive structure 129, which are removed using, for example, a wet chemical etching technique or other technique known to those skilled in the art.

Figure 16:
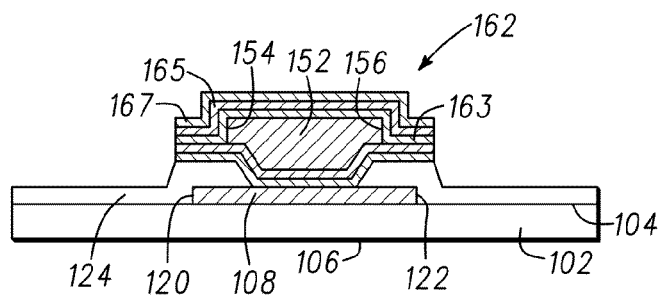
FIG. 16 is a cross-sectional view of a semiconductor component in accordance with another embodiment of the present invention.

For the sake of completeness, FIG. 16 is included to illustrate embodiments in which a semiconductor component 250 includes an electrically conductive layer 162 that is a three metal layer structure or system comprising an electrically conductive layer 163 formed in contact with electrically conductive structure 152, an electrically conductive layer 165 formed in contact with electrically conductive layer 163, and an electrically conductive layer 167 in contact with electrically conductive layer 165. For example, electrically conductive layer 163 may be nickel, electrically conductive layer 165 may be palladium, and electrically conductive layer 167 may be gold. Alternatively, electrically conductive layer 163 may be copper, electrically conductive layer 165 may be nickel, and electrically conductive layer 167 may be gold; electrically conductive layer 163 may be copper, electrically conductive layer 165 may be nickel, and electrically conductive layer 167 may be tin; or electrically conductive layer 163 may be copper, electrically conductive layer 165 may be nickel, and electrically conductive layer 167 may be palladium; or electrically conductive layer 163 may be copper, electrically conductive layer 165 may be tin, and electrically conductive layer 167 may be palladium; or the like. It should be noted that the number of electrically conductive layers comprising electrically conductive structure 162 is not a limitation of the present invention, i.e., electrically conductive structure 162 may be comprised of a single layer, two layers, three layers, four, layers, etc.

Figure 17:
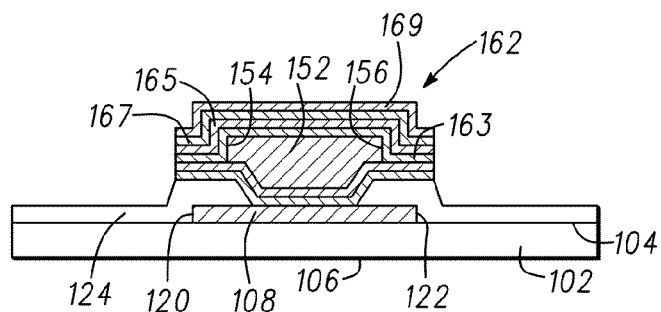
FIG. 17 is a cross-sectional view of a semiconductor component in accordance with another embodiment of the present invention.

FIG. 17 is included to illustrate embodiments in which a semiconductor component 260 includes an electrically conductive layer 162 that is a four metal layer structure or system comprising an electrically conductive layer 163 formed in contact with electrically conductive structure 152, an electrically conductive layer 165 formed in contact with electrically conductive layer 163, an electrically conductive layer 167 in contact with electrically conductive layer 165, and an electrically conductive layer 169 formed in contact with electrically conductive layer 167. For example, electrically conductive layer 163 may be copper, electrically conductive layer 165 may be nickel, electrically conductive layer 167 may be palladium, and electrically conductive layer 169 may be gold. As discussed above, layer 162 is not limited to being comprised of an electrically conductive material, but can be comprised of an electrically non conductive material such as, for example, epoxy, polyimide, or the like.

By now it should be appreciated that a semiconductor component having a copper protection layer and methods for manufacturing the semiconductor component have been provided. Advantages of embodiments of the present invention include a protective structure 162 adjacent the copper sidewalls protecting them from damage by etchants or other corrosive materials, prevention of copper migration, and elimination of an expensive electroless plating process. In addition, protective structure 162 forms a seal that protects electrically conductive structure 152 while allowing for overetching of protective structure 162 without uncovering the copper sidewalls or edges of electrically conductive structure 152.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a material having a major surface;
   forming a first electrically conductive structure over the major surface;
   forming a layer of photoresist over the first electrically conductive structure;
   exposing a first portion of the layer of photoresist to radiation, the first portion having a first dimension; and
   exposing a second portion of the layer of photoresist to radiation, the second portion having a second dimension that is larger than the first dimension.

2. The method of claim 1, wherein the photoresist is a positive photoresist.

3. The method of claim 1, wherein exposing the second portion of the layer of photoresist includes exposing the second portion to radiation before hard baking the layer of photoresist.

4. The method of claim 1, further including before exposing the second portion of the layer of photoresist to radiation, removing the first portion of the layer of photoresist to uncover a first portion of the first electrically conductive structure.

5. The method of claim 4, further including forming a second electrically conductive structure over the first portion of the first electrically conductive structure, the second electrically conductive structure having first and second edges.

6. The method of claim 5, further including after exposing the second portion of the layer of photoresist to radiation, uncovering at least the first edge of the second electrically conductive structure.

7. The method of claim 6, further including forming a structure at least on the first edge of the second electrically conductive structure that was uncovered.

8. The method of claim 6, further including after exposing the second portion of the layer of photoresist to radiation, uncovering at least the second edge of the second electrically conductive structure.

9. The method of claim 8, further including forming a protective structure on the first and second edges of the second electrically conductive structure.

10. The method of claim 9, wherein the protective structure is one of an electrically conductive material or an electrically non-conductive material.

\* \* \* \* \*